United States Patent
Hsu et al.

(10) Patent No.: US 9,000,425 B2
(45) Date of Patent: Apr. 7, 2015

(54) ORGANIC LIGHT EMITTING DIODE, AND PANEL AND DISPLAY USING THE SAME

(71) Applicant: InnoLux Corporation, Miao-Li County (TW)

(72) Inventors: Ming-Hung Hsu, Miao-Li County (TW); Yin-Jui Lu, Miao-Li County (TW); Jin-Ju Lin, Miao-Li County (TW); Huai-Ting Shih, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 13/934,367

(22) Filed: Jul. 3, 2013

(65) Prior Publication Data

US 2014/0014926 A1      Jan. 16, 2014

(30) Foreign Application Priority Data

Jul. 10, 2012   (TW) ............................. 101124764 A

(51) Int. Cl.
| H01L 35/24 | (2006.01) |
| H01L 51/00 | (2006.01) |
| H01L 51/50 | (2006.01) |
| H01L 51/52 | (2006.01) |

(52) U.S. Cl.
CPC ........ *H01L 51/5056* (2013.01); *H01L 51/5044* (2013.01); *H01L 51/5265* (2013.01)

(58) Field of Classification Search
USPC ............................................. 257/40; 438/29
See application file for complete search history.

(56) References Cited

U.S. PATENT DOCUMENTS

| 2010/0288362 A1* | 11/2010 | Hatwar et al. ................ 136/263 |
| 2011/0084600 A1* | 4/2011 | Kim et al. ...................... 313/504 |
| 2012/0098412 A1* | 4/2012 | Shin et al. ...................... 313/498 |
| 2013/0026456 A1* | 1/2013 | Hwang et al. ................... 257/40 |

* cited by examiner

*Primary Examiner* — Phuc Dang
(74) *Attorney, Agent, or Firm* — Bacon & Thomas, PLLC

(57) ABSTRACT

An organic light emitting diode, and a panel and a display using the same are disclosed. The organic light emitting diode of the present invention comprises: a reflecting layer; a resonance enhancing layer disposed on the reflecting layer; a first electrode disposed on the resonance enhancing layer, wherein the resonance enhancing layer is disposed between the reflecting layer and the first electrode; an organic layer disposed on the first electrode; and a second electrode disposed on the organic layer, wherein the organic layer is disposed between the first electrode and the second electrode.

17 Claims, 6 Drawing Sheets

ORGANIC LIGHT EMITTING DIODE, AND PANEL AND DISPLAY USING THE SAME

CROSS REFERENCE TO RELATED APPLICATION

This application claims the benefits of the Taiwan Patent Application Serial Number 101124764, filed on Jul. 10, 2012, the subject matter of which is incorporated herein by reference.

BACKGROUND OF THE INVENTION

1. Field of the Invention

The disclosure relates to an organic light emitting diode, and a panel and a display using the same. More specifically, the present invention relates to a white organic light emitting diode, and a panel and a display using the same.

2. Description of Related Art

Organic light-emitting diodes (OLED) are light in weight and ultra-thin in thickness, and also have advantages of high brightness, rapid response, wide viewing angles, no backlight requirement, low manufacturing cost and flexibility. Hence, OLEDs have great potential to apply on display panels of various electronic devices such as panels of cell phones, vehicles and MP3 players.

OLEDs can be classified into red OLEDs, blue OLEDs, green OLEDs and white OLEDs based on colours of emitting light. In the white OLEDs, white light is obtained by using several fluorescent or phosphor materials with different colours at the same time. Conventional white OLEDs are usually tandem OLEDs with plural light emitting units connecting in series by connecting layers, which have high light emitting efficiency and brightness.

However, the equivalent optical thickness of the conventional OLEDs is substantially the same as the cavity length in which visible light wavelength forming destructive interference or constructive interference, so a problem that the intensity of one primary color is enhanced and that of the other primary color is decreased may be occurred. In addition, even though OLEDs are developed in which the distance for forming constructive interference can correspond with the wavelength differences between three primary colors, a blue shift may be occurred in resonance wavelengths and thereby a color shift is occurred. Furthermore, when a light emitting layer and an electrode is too close, the energy of the light emitting from the light emitting layer may be coupled, and the coupled energy enters into a surface plasmon mode. In this case, the light emitting efficiency may be decreased.

Hence, it is desirable to provide an OLED to prevent the problem of color shifts and improve the light emitting efficiency thereof.

SUMMARY OF THE INVENTION

An object of the disclosure is to provide an organic light emitting diode (OLED), and a panel and a display using the same, which can prevent the problem of color shifts from side viewing angles and improve light color and light emitting efficiency.

To achieve the object, the OLED of the present invention comprises: a reflecting layer, a resonance enhancing layer, a first electrode, an organic layer and a second electrode. The resonance enhancing layer is disposed on the reflecting layer; the first electrode is disposed on the resonance enhancing layer, and the resonance enhancing layer is disposed between the reflecting layer and the first electrode; the organic layer is disposed on the first electrode; the second electrode is disposed on the organic layer, and the organic layer is disposed between the first electrode and the second electrode. Herein, each the first electrode and the second electrode is respectively a transparent electrode, a semi-transparent electrode, or a combination thereof.

In the OLED of the present invention, the emitting side thereof is a side corresponding to the second electrode, regardless the OLED of the present invention is a top-emitting OLED or a bottom-emitting OLED.

In one embodiment of the OLED of the present invention, the first electrode and the second electrode are respectively a transparent electrode, a semi-transparent electrode, or a combination thereof. In comparison with a conventional OLED having at least one electrode made of a metal electrode, the transparent or semi-transparent electrodes of the present invention can improve the problem of color shifts from side viewing angles. In addition, the OLED of the present invention further comprises a reflecting layer and a resonance enhancing layer. The resonance enhancing layer can increase a distance between the organic layer and the reflecting layer, so the energy coupling of the light emitting from the organic layer, in which the coupled energy enters into a surface plasmon mode, can be decreased, and thereby the light emitting efficiency can further be improved. In addition, the resonance enhancing layer also can increase equivalent optical thickness. In the conventional OLED, the equivalent optical thickness is about 100 nm-300 nm, which is similar to the differences of wavelengths forming destructive interference or constructive interference in this OLED. In addition, it is known that the wavelength differences between three primary colors including red, green and blue are also about 100 nm. Hence, the problem that the intensity of one primary color is enhanced and that of the other primary color is decreased may be occurred in the OLED with a conventional resonance cavity having equivalent optical thickness of 100 nm-300 nm. Furthermore, even though an OLED is developed in which the distance for forming constructive interference can correspond with the three primary colors, a blue shift may be occurred in resonance wavelengths in large viewing angles and thereby a color shift is occurred. On the contrary, the resonance enhancing layer of the present invention can greatly increase the equivalent optical thickness thereof, for example in a range of 1 μm to 3 μm. Hence, the differences of wavelengths forming constructive or destructive interference are greatly shorter than the wavelength differences between three primary colors including red, green and blue. Therefore, the intensities of peaks of whole emitting light can be highly and uniformly enhanced, so the color shifts from side viewing angles can be improved, and the limitations on optical structures and process conditions can further be eliminated.

In the OLED of the present invention, the resonance enhancing layer can be a planar layer, a filler layer, or an air gap. Herein, the material of the resonance enhancing layer is not particularly limited, as long as this material has enough light transmittance and a refractive index thereof is 1.0 or more.

In the case that the OLED is a top-emitting OLED, the resonance enhancing layer may be a planar layer. In this case, a thickness of the resonance enhancing layer is in a range from 500 nm to 10 μm. In one embodiment, the thickness thereof is in a range from 1 μm to 5 μm. In addition, the refractive index thereof can be 1.0 or more. In one embodiment, the refractive index thereof is in a range from 1.0 to 2.0. In another embodiment, the refractive index thereof is in a range from 1.3 to 2.0. In further another embodiment, the refractive index thereof is in a range from 1.5 to 2.0. Furthermore, a protective layer may further be disposed on the second electrode of the top-emitting OLED.

In the case that the OLED is a bottom-emitting OLED, a protective layer may be disposed between the first electrode and the resonance enhancing layer. Herein, the resonance enhancing layer can be a planar layer, a filler layer, or an air gap. In some aspects, the protective layer may be thickened to serve as a resonance enhancing layer. When the resonance enhancing layer is an air gap, the refractive index thereof is 1.0, and the thickness thereof may be in a range from 1 µm to 10 µm. When the resonance enhancing layer is a filler layer, a planar layer or a thickened protective layer, the refractive index thereof may be 1.0 or more; the refractive index thereof is in a range from 1.0 to 2.0 in one embodiment; the refractive index thereof is in a range from 1.3 to 2.0 in another embodiment; and the refractive index thereof is in a range from 1.5 to 2.0 in further another embodiment. In addition, when the resonance enhancing layer is a filler layer, a planar layer or a thickened protective layer, the thickness thereof can be in a range from 500 nm to 10 µm and is in a range from 1 µm to 5 µm in another embodiment.

The material for the planar layer of the present invention can be any material for forming the planar layer generally used in the art, such as organic or inorganic insulating materials. Examples of the organic insulating materials comprise: polyethylene naphthalate (PEN), poly(methyl methacrylate) (PMMA), and polyimide (PI); and examples of the inorganic insulating materials comprise: oxides such as aluminum oxide and silicon oxide, and nitrides such as silicon nitride.

In the OLED of the present invention, the reflecting layer can be a metal layer with excellent reflectivity, and the material thereof can be Al, Al alloy, Ag or Ag alloy. In addition, the transparent electrode used in the OLED of the present invention can be any transparent conductive oxide (TCO) electrode generally used in the art, such as an ITO electrode or an IZO electrode. Furthermore, the semi-transparent electrode used herein can be any metal thin-film electrode generally used in the art, such as an Mg/Ag alloy thin-film electrode, an Ag thin-film electrode, a Pt thin-film electrode and an Al thin-film electrode. If it is necessary, at least one of the first electrode and the second electrode used in the present invention can be a composite electrode of a transparent electrode and a semi-transparent electrode, such as a composite electrode of a TCO electrode and a Pt thin-film electrode; or a stacked electrode of a transparent electrode and a semi-transparent electrode, such as a stacked electrode of a TCO electrode and a Pt thin-film electrode.

In the OLED of the present invention, the organic layer may comprise plural light emitting units, and selectively plural connecting layers to form a tandem OLED. When the organic layer comprises connecting layers, one of the connecting layers is disposed between the two adjacent light emitting units. Herein, the materials of the connecting layers can be any n-type connecting material or p-type connecting material such as $Alq_3$:Li and $MoO_3$. In addition, each light emitting unit may respectively comprise: an electron transport/injection layer, a light emitting layer, and a hole transport/injection layer, wherein the light emitting layer is disposed between the electron transport/injection layer and the hole transport/injection layer. Not only phosphor materials with high light emitting efficiency but also fluorescent materials with relative low light emitting efficiency can be used in the light emitting layer of the present invention due to the disposition of the resonance enhancing layer.

Furthermore, the OLED of the present invention is not particularly limited to a white OLED, and can be manufactured into a red, blue or green OLED based on user's requirements.

In addition, the present invention also provides an OLED panel comprising the aforementioned OLED, which comprises: a transparent substrate; and plural aforementioned OLED. Herein, the OLEDs are disposed on the transparent substrate by a side corresponding to the first electrode or a side corresponding to the second electrode. Furthermore, the transparent substrate can be a plastic substrate or a glass substrate.

Moreover, the present invention also provides an OLED display device, which comprises the aforementioned OLED panel.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1:
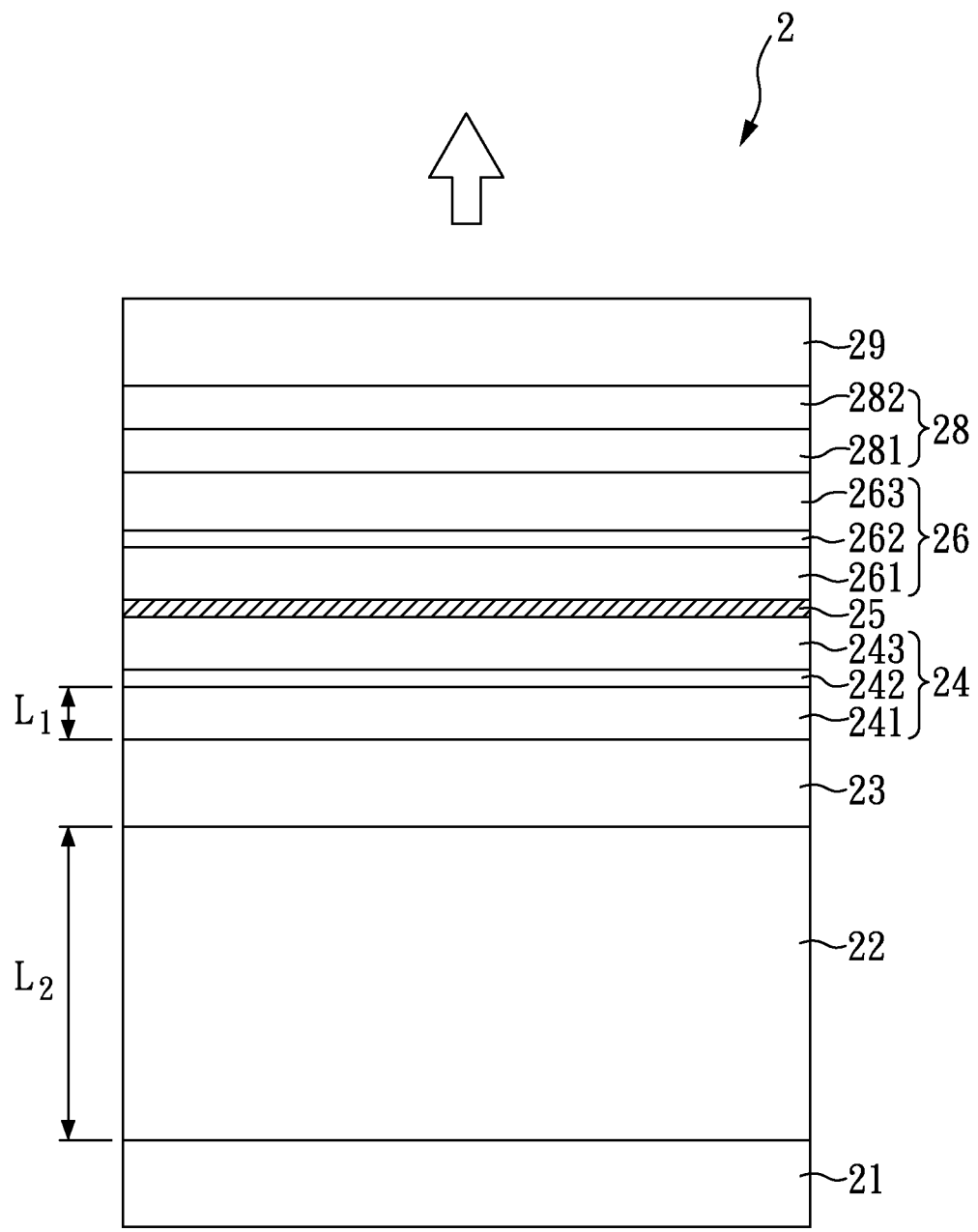
FIG. 1 is a cross-sectional view of an OLED according to Embodiment 1 of the present invention.

FIG. 1 is a cross-sectional view of an OLED of the present embodiment. As shown in FIG. 1, the OLED 2 of the present embodiment comprises: a reflecting layer 21, a resonance enhancing layer 22, a first electrode 23, a first light emitting unit 24, a second light emitting unit 26 and a second electrode 28. The resonance enhancing layer 22 is disposed on the reflecting layer 21. The first electrode 23 is disposed on the resonance enhancing layer 22, wherein the resonance enhancing layer 22 is disposed between the reflecting layer 21 and the first electrode 23. The first light emitting unit 24 and the second light emitting unit 26 are sequentially laminated on the first electrode 23 and disposed between the first electrode 23 and the second electrode 26, and a connecting layer 25 is disposed between the first light emitting unit 24 and the second light emitting unit 26. The second electrode 28 is disposed on the second light emitting unit 26. In addition, a protective layer 29 is further laminated on the second electrode 28.

In the present embodiment, the first light emitting unit 24 comprises a first electron transport layer 241, a first light emitting layer 242 and a first hole transport layer 243, wherein the first light emitting layer 242 is disposed between the first electron transport layer 241 and the first hole transport layer 243. The second light emitting unit 26 comprises a second electron transport layer 261, a second light emitting layer 262 and a second hole transport layer 263, wherein the second light emitting layer 262 is disposed between the second electron transport layer 261 and the second hole transport layer 263.

In addition, the reflecting layer 21 of the present embodiment is a metal layer, and the material thereof is Ag. The first electrode 23 is a transparent electrode, and the material thereof is ITO. The second electrode 28 is a composite electrode of a transparent electrode 282 and a metal thin-film electrode 281 (i.e. semi-transparent electrode), wherein the material of the transparent electrode 282 is ITO, and that of the metal thin-film electrode 281 is Mg/Ag alloy. In other embodiments, the second electrode 28 may be a single-layer electrode, such as a transparent electrode or a semi-transparent electrode.

Furthermore, the resonance enhancing layer 22 is a planar layer, and a thickness $L_2$ thereof can be in a range from 500 nm to 10 μm. In some case, the thickness $L_2$ thereof is in a range from 1 μm to 5 μm. In addition, a refractive index of the resonance enhancing layer 22 is 1.0 or more. The resonance enhancing layer 22 can increase the thickness of the resonance cavity between the first light emitting layer 242 and reflecting layer 21, so the energy coupling of the light emitted from the first light emitting layer 242 can be decreased and the light emitting efficiency of the OLED can further be improved.

In the present embodiment, the material of the first light emitting layer 242 can be yellow phosphor, and that of the second light emitting layer 262 can be blue phosphor. After the yellow light emitted from the first light emitting layer 242 mixes with the blue light emitted from the second light emitting layer 262, a white light can be obtained. In addition, the OLED 2 provided in the present embodiment is a top-emitting OLED, and the direction of the emitting light is indicated by the arrow shown in FIG. 1.

Embodiment 2

Figure 2:
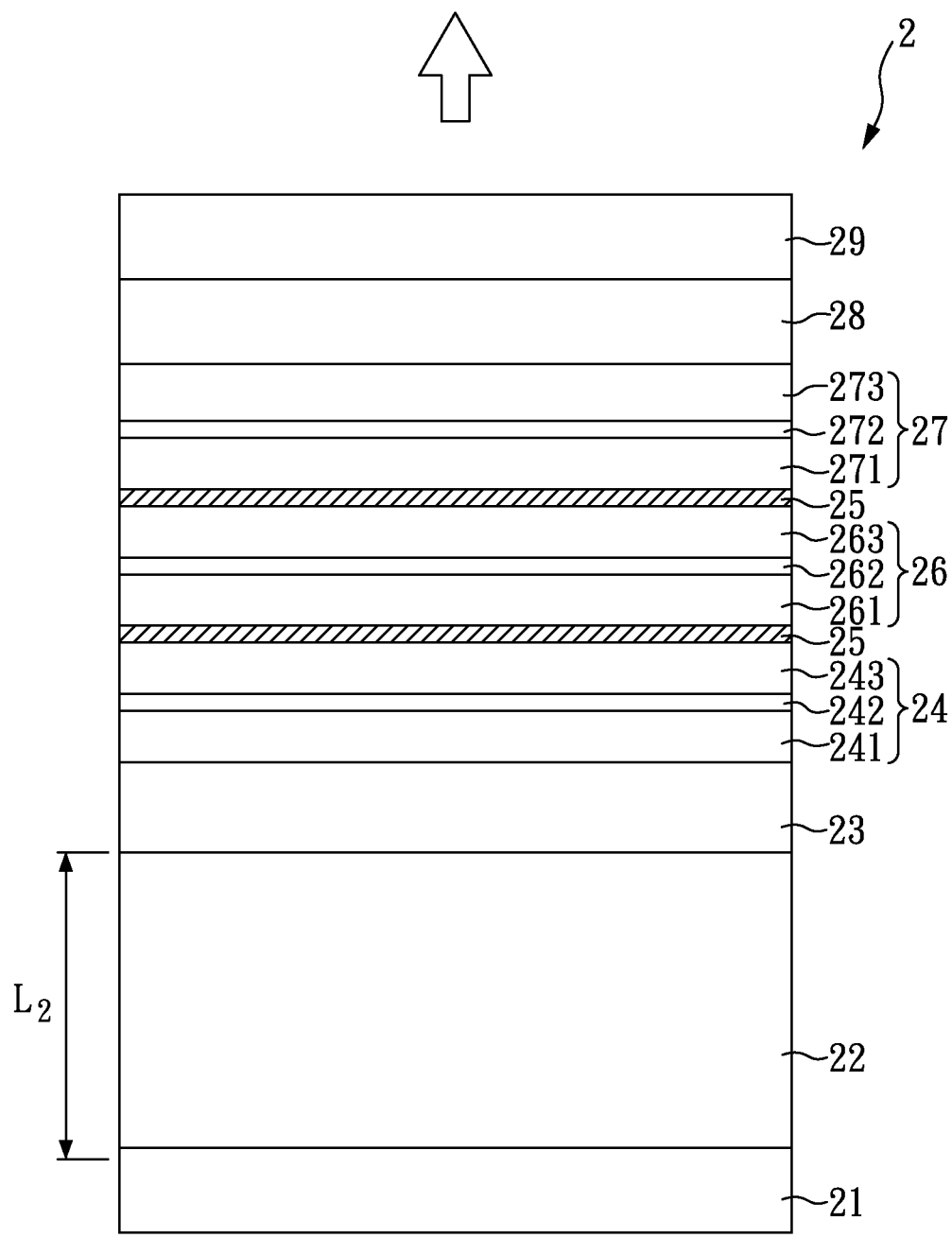
FIG. 2 is a cross-sectional view of an OLED according to Embodiment 2 of the present invention.

FIG. 2 is a cross-sectional view of an OLED of the present embodiment. As shown in FIG. 2, the structure of the OLED of the present embodiment is similar to that of Embodiment 1, except the following differences.

The OLED of the present embodiment comprises three light emitting units. These three light emitting units comprise the first light emitting unit 24 and the second light emitting unit 26 of Embodiment 1, and further comprise a third light emitting unit 27. The third light emitting unit 27 comprises a third electron transport layer 271, a third light emitting layer 272 and a third hole transport layer 273, wherein the third light emitting layer 272 is disposed between the third electron transport layer 271 and the third hole transport layer 273. In addition, another connecting layer 25 is disposed between the third light emitting unit 27 and the second light emitting unit 26.

In the OLED of the present embodiment, both the second electrode 28 and the first electrode 23 are transparent conductive oxide (TCO) electrodes. Both the two electrodes of the present embodiment are non-metal electrodes, so the interference effect occurred in the OLED of the present embodiment can be further reduced, in comparison to the OLED of Embodiment 1 in which the second electrode is a composite electrode of a transparent electrode and a metal thin-film electrode. Thus, the color shifts from different viewing angles can be greatly reduced in the present embodiment.

In addition, in the OLED of the present embodiment, the material of the first light emitting layer 242 can be a red fluorescent material, that of the second emitting layer 262 can be a green fluorescent material, and that of the third emitting layer 272 can be a blue fluorescent material. After the red light emitted from the first light emitting layer 242, the green light emitted from the second emitting layer 262 and the blue light emitted from the third light emitting layer mix with each other, a white light can be obtained.

In the conventional OLED, even though an OLED with three light emitting layers is manufactured, it is still difficult to keep light emitting efficiencies of all these three light emitting layers and solve the problem of color shifts from side viewing angles at the same time. Hence, the conventional OLED with three light emitting layers cannot meet the commercialized requirement. On the contrary, the OLED of the present embodiment comprises a planar layer as a resonance enhancing layer 22 and both the first electrode 23 and the second electrode 28 thereof are non-metal electrodes; so the destructive interference occurred in the OLED of the present embodiment can be reduced and a better light emitting efficiency can be obtained. Hence, when OLEDs with structures similar to that of the present embodiment are manufactured, not only phosphor materials but also fluorescent materials can be used in the light emitting layers, and especially a green fluorescent material with long life time can be used in the light emitting layers to prepare OLEDs.

Embodiment 3

Figure 3:
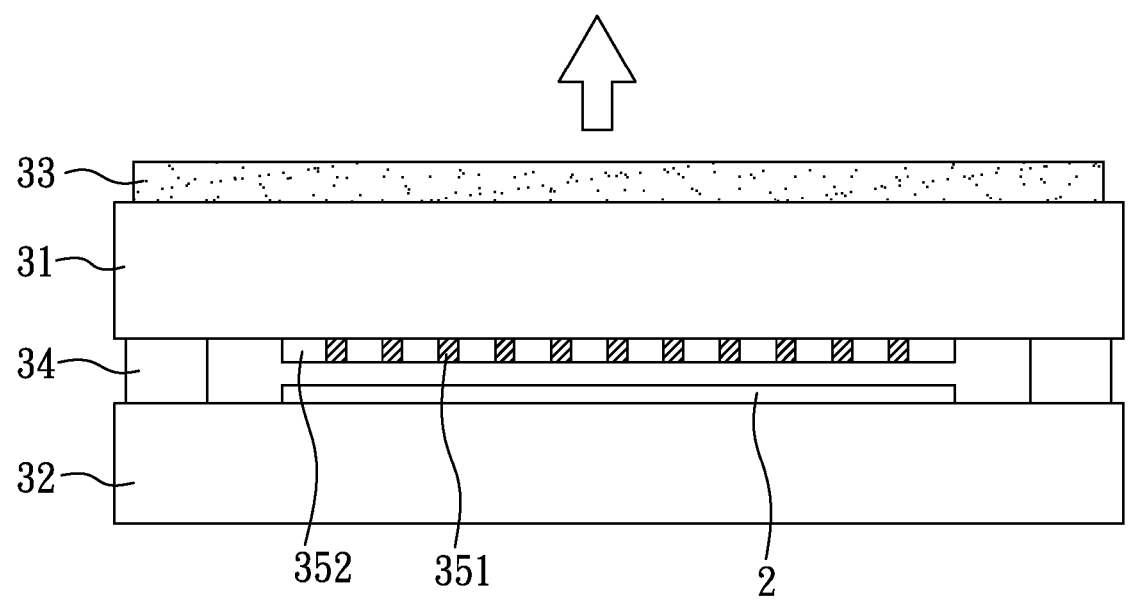
FIG. 3 is a cross-sectional view of an OLED panel according to Embodiment 3 of the present invention.

FIG. 3 is a cross-sectional view of an OLED panel of the present embodiment. As shown in FIG. 3, the OLED panel of the present embodiment comprises: a substrate 32; and an OLED 2 disposed on the substrate 32.

In the present embodiment, the OLED 2 can be any one of the OLEDs of Embodiment 1 or Embodiment 2, so the description of the detail structure thereof is omitted herein. Both the OLEDs of Embodiment 1 and Embodiment 2 are top-emitting OLEDs, so the OLED 2 is disposed on the substrate 32 by a side corresponding to the first electrode and the reflecting layer, i.e. the non-emitting side. Furthermore, the OLED panel of the present embodiment further comprises: a transparent substrate 31, plural spacers 351, plural color filter units 352 and sealing units 34. Herein, the spacers 351 are disposed between two adjacent color filter units 352 to inhibit the lights emitting from the adjacent color filter units 352 interfering with each other. In addition, the OLED 2 is disposed between the transparent substrate 31 and the substrate 32, and sealed with sealing units 34. In the present embodiment, the spacer 351 can be a black matrix generally used in the art.

Furthermore, a polarized unit 33 can be selectively disposed on the emitting side of the OLED panel, i.e. another side of the transparent substrate 31 opposite to a side thereof that the spacers 351 and the color filter units 352 disposed thereon, in order to reduce reflection caused by environmental light and increase contrast ratio. However, the present invention is not limited thereto, and other OLED panels may not comprise this polarized unit 33.

Embodiment 4

Figure 4:
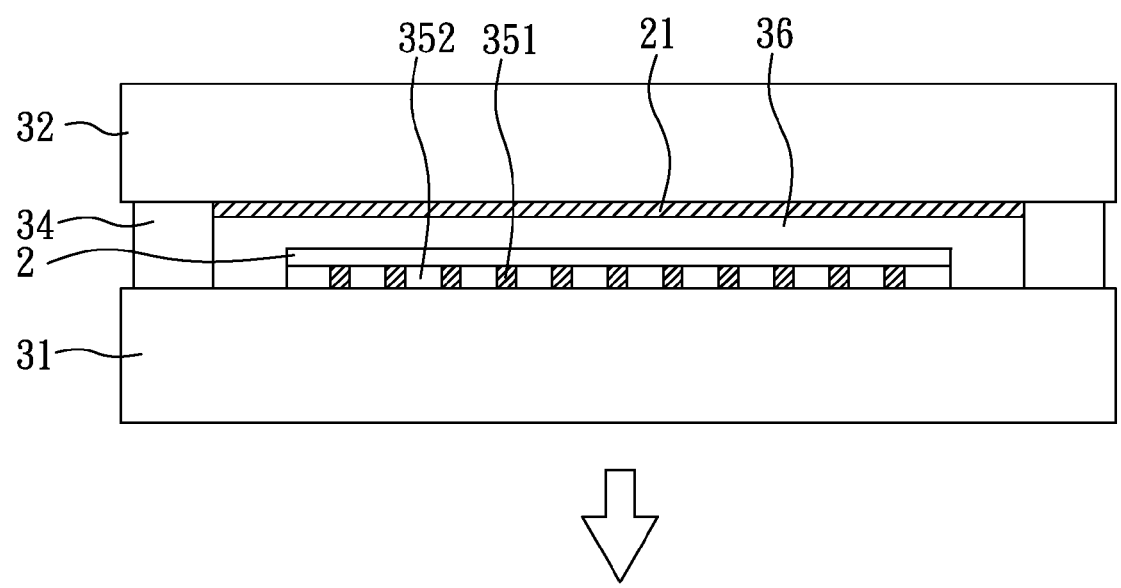
FIG. 4 is a cross-sectional view of an OLED panel according to Embodiment 4 of the present invention.
Figure 5:
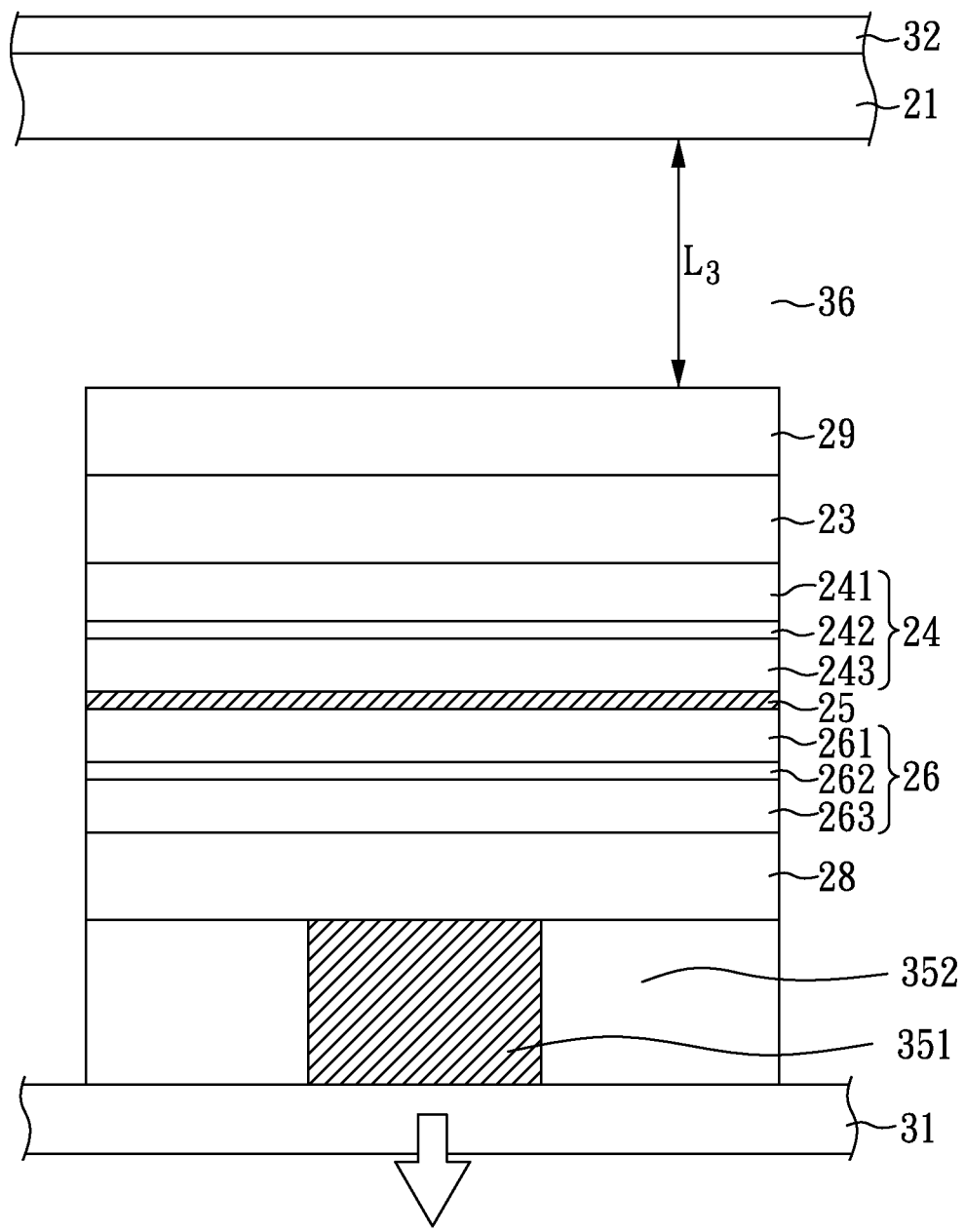
FIG. 5 is a cross-sectional view of an OLED according to Embodiment 4 of the present invention.

The present embodiment provides a bottom-emitting OLED and an OLED panel comprising the same, wherein FIG. 4 is a cross-sectional view of the OLED panel of the present embodiment, and FIG. 5 is a cross-sectional view of the OLED of the present embodiment.

As shown in FIG. 4, the OLED panel of the present embodiment is similar to that of Embodiment 3, except that the OLED 2 of the present embodiment is a bottom-emitting OLED, the reflecting layer 21 is disposed on the substrate 32, and the air gap between the reflecting layer 21 and the OLED 2 is used as a resonance enhancing layer 36.

As shown in FIG. 5, the structure of the OLED of the present embodiment is similar to that of Embodiment 2, except the following differences.

The structure of the OLED 2 of the present embodiment is obtained by inverting the OLED of Embodiment 1, so the OLED 2 of the present embodiment is a bottom-emitting OLED. In addition, both the second electrode 28 and the first electrode 23 of the present embodiment are transparent electrodes. The protective layer 29 is disposed on the first electrode 23. The air gap is used as the resonance enhancing layer 36 in the OLED of the present embodiment. The distance $L_3$ between the reflecting layer 21 and the protective 29 can be in a range from 500 nm to 10 μm. In some case, the distance $L_3$ is in a range from 1 μm to 5 μm.

Furthermore, as shown in FIG. 4 and FIG. 5, the OLED 2 of the present embodiment is a bottom-emitting OLED, which is disposed on the transparent substrate 31 by the emitting side, i.e. a side corresponding to the second electrode 28. In addition, plural spacers 351 and plural color filter units 352 are disposed between the OLED 2 and the transparent substrate 31.

Embodiment 5

The structures of the OLED and the OLED panel comprising the same of the present embodiment are similar to those described in Embodiment 4, except that the thickness of the protective layer is in a range from 500 nm to 10 μm. In some case, the thickness thereof is in a range from 1 μm to 5 μm. Hence, the protective layer of the present invention can be used as not only a protective layer but also a resonance enhancing layer.

Embodiment 6

Figure 6:
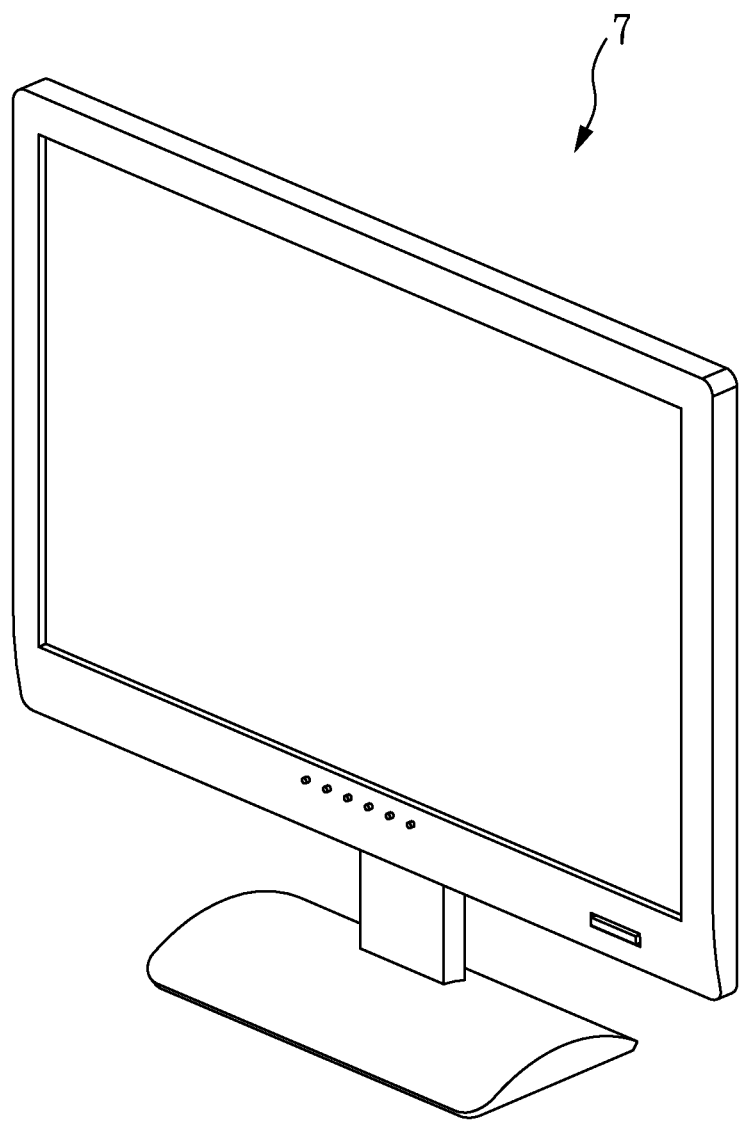
FIG. 6 is a perspective view of an OLED display device according to Embodiment 6 of the present invention.

FIG. 6 is a perspective view of an OLED display device of the present embodiment, in which the OLED display device 7 comprises the aforementioned OLED panel.

In other embodiments, the OLED panel of the present invention can also be used in other display devices such as cellular phones or flat panel displays.

Although the present invention has been explained in relation to its preferred embodiment, it is to be understood that many other possible modifications and variations can be made without departing from the spirit and scope of the invention as hereinafter claimed.

What is claimed is:
1. An organic light emitting diode, comprising:
a reflecting layer;
a resonance enhancing layer disposed on the reflecting layer;
a first electrode disposed on the resonance enhancing layer, wherein the resonance enhancing layer is disposed between the reflecting layer and the first electrode;
an organic layer disposed on the first electrode; and
a second electrode disposed on the organic layer, wherein the organic layer is disposed between the first electrode and the second electrode,
wherein a thickness of the resonance enhancing layer is in a range from 500 nm to 10 μm.

2. The organic light emitting diode as claimed in claim 1, wherein a refractive index of the resonance enhancing layer is 1.0 or more.

3. The organic light emitting diode as claimed in claim 1, wherein the resonance enhancing layer is a planar layer, a filler layer, or an air gap.

4. The organic light emitting diode as claimed in claim 1, wherein the reflecting layer is a metal layer made of Al, Al alloy, Ag, or Ag alloy.

5. The organic light emitting diode as claimed in claim 1, wherein the organic layer comprises: plural light emitting units and plural connecting layers, and one of the connecting layers is disposed between the two adjacent light emitting units.

6. The organic light emitting diode as claimed in claim 1, wherein each light emitting unit respectively comprises: an electron transport layer, a light emitting layer, and a hole transport layer, and the light emitting layer is disposed between the electron transport layer and the hole transport layer.

7. The organic light emitting diode as claimed in claim 1, wherein each the first electrode and the second electrode is respectively a transparent conductive oxide electrode, which is an ITO electrode or an IZO electrode.

8. The organic light emitting diode as claimed in claim 1, wherein each the first electrode and the second electrode is respectively a semi-transparent electrode, which is a metal thin-film electrode.

9. An OLED panel, comprising:
a transparent substrate; and
plural organic light emitting diodes, wherein each the organic light emitting diode comprises:
a reflecting layer;
a resonance enhancing layer disposed on the reflecting layer;
a first electrode disposed on the resonance enhancing layer, wherein the resonance enhancing layer is disposed between the reflecting layer and the first electrode;
an organic layer disposed on the first electrode; and
a second electrode disposed on the organic layer, wherein the organic layer is disposed between the first electrode and the second electrode,
wherein the organic light emitting diodes are disposed on the transparent substrate by a side corresponding to the first electrode or a side corresponding to the second electrode,
wherein a thickness of the resonance enhancing layer is in a range from 500 nm to 10 μm.

10. The OLED panel as claimed in claim 9, wherein a refractive index of the resonance enhancing layer is 1.0 or more.

11. The OLED panel as claimed in claim 9, wherein the resonance enhanceng layer is a planar layer, a filler layer, or an air gap.

12. The OLED panel as claimed in claim 9, wherein the reflecting layer is a metal layer made of Al, Al alloy, Ag, or Ag alloy.

13. The OLED panel as claimed in claim 9, wherein the organic layer comprises: plural light emitting units and plural connecting layers, and one of the connecting layers is disposed between the two adjacent light emitting units.

14. The OLED panel as claimed in claim 9, wherein each light emitting unit respectively comprises: an electron transport layer, a light emitting layer, and a hole transport layer, and the light emitting layer is disposed between the electron transport layer and the hole transport layer.

15. The OLED panel as claimed in claim 9, wherein each the first electrode and the second electrode is respectively a transparent conductive oxide electrode, which is an ITO electrode or an IZO electrode.

16. The OLED panel as claimed in claim 9, wherein each the first electrode and the second electrode is respectively a semi-transparent electrode, which is a metal thin-film electrode.

17. An OLED display device, comprising:
an OLED panel comprising: a transparent substrate; and plural organic light emitting diodes, wherein each the organic light emitting diode comprises:
a reflecting layer;
a resonance enhancing layer disposed on the reflecting layer;
a first electrode disposed on the resonance enhancing layer, wherein the resonance enhancing layer is disposed between the reflecting layer and the first electrode;
an organic layer disposed on the first electrode; and
a second electrode disposed on the organic layer, wherein the organic layer is disposed between the first electrode and the second electrode,
wherein the organic light emitting diodes are disposed on the transparent substrate by a side corresponding to the first electrode or a side corresponding to the second electrode,
wherein a thickness of the resonance enhancing layer is in a range from 500 nm to 10 μm.

\* \* \* \* \*